United States Patent
Yamamoto

(10) Patent No.: US 7,268,836 B2
(45) Date of Patent: Sep. 11, 2007

(54) TELEVISION TUNER DEVICE GENERATING INTERMEDIATE-FREQUENCY SIGNAL FREE FROM HARMONIC INTERFERENCE OF REFERENCE SIGNAL

(75) Inventor: Masaki Yamamoto, Fukushima-ken (JP)

(73) Assignee: Alps Electric Co., Ltd., Tokyo (JP)

( * ) Notice: Subject to any disclaimer, the term of this patent is extended or adjusted under 35 U.S.C. 154(b) by 483 days.

(21) Appl. No.: 10/932,748

(22) Filed: Sep. 2, 2004

(65) Prior Publication Data

US 2005/0046750 A1 Mar. 3, 2005

(30) Foreign Application Priority Data

Sep. 3, 2003 (JP) ............... 2003-270953

(51) Int. Cl.
H04N 5/44 (2006.01)
H04N 5/50 (2006.01)
H04N 5/62 (2006.01)
H03J 1/00 (2006.01)
H03J 3/00 (2006.01)
H03J 5/00 (2006.01)
H04B 1/10 (2006.01)
H04B 15/06 (2006.01)

(52) U.S. Cl. ............. 348/731; 348/87; 348/607; 348/725; 348/736; 348/737; 334/85; 455/300; 455/301; 455/310; 455/317

(58) Field of Classification Search ............. 348/87, 348/725, 607, 731, 736, 737; 334/85; 361/770; 455/300.301, 310, 317, 333
See application file for complete search history.

(56) References Cited

U.S. PATENT DOCUMENTS

| | | | | |
|---|---|---|---|---|
| 5,050,238 A | * | 9/1991 | Tomizuka et al. | 455/300 |
| 5,111,274 A | * | 5/1992 | Tomizuka et al. | 257/659 |
| 5,369,552 A | * | 11/1994 | Barnes et al. | 361/816 |
| 5,710,999 A | * | 1/1998 | Iwase et al. | 455/349 |
| 6,131,023 A | * | 10/2000 | Matsuura | 455/301 |
| 6,160,571 A | * | 12/2000 | Wang | 725/127 |
| 7,030,939 B2 | * | 4/2006 | Yamamoto | 348/731 |
| 7,042,529 B2 | * | 5/2006 | Wakamori et al. | 348/836 |
| 2006/0050186 A1 | * | 3/2006 | Hosoi | 348/818 |

FOREIGN PATENT DOCUMENTS

| | | |
|---|---|---|
| JP | 10-32514 | 2/1998 |
| JP | U3096172 | 6/2003 |

* cited by examiner

*Primary Examiner*—Brian P. Yenke
(74) *Attorney, Agent, or Firm*—Brinks Hofer Gilson & Lione

(57) ABSTRACT

A television tuner device includes a metal frame, including a shielding plate which separates the space defined by the metal frame into a first chamber at a first side plate and a second chamber at a second side plate opposite to the first side plate; a distribution unit may be disposed in the first chamber; a tuning unit disposed in the second chamber includes a mixer circuit converting a television signal into an intermediate-frequency signal, an oscillator provides the mixer circuit with an oscillated signal, and a phase-locked-loop (PLL) circuit controls the oscillation frequency of the oscillator; and a crystal oscillator disposed in the first chamber provides the PLL circuit with a reference signal.

16 Claims, 2 Drawing Sheets

TELEVISION TUNER DEVICE GENERATING INTERMEDIATE-FREQUENCY SIGNAL FREE FROM HARMONIC INTERFERENCE OF REFERENCE SIGNAL

This application claims priority to Japanese Patent Application No.: 2003-270953, filed on Sep. 3, 2003, which is incorporated herein by reference.

FIELD OF THE INVENTION

The present application relates to television tuner devices for distributing input television signals and outputting distributed television signals.

BACKGROUND

A known television tuner device will now be illustrated with reference to FIG. 2, which is a plan view of the layout of blocks in the television tuner device. A rectangular metal frame 21 having four side plates includes four compartments 25 to 28 separated by shielding plates 24. The compartment 25 contains a distributing unit, the compartment 26 contains a tuning unit, the compartment 27 contains a demodulating unit, and the compartment 28 contains a switching unit and a modulating unit. These circuit components are normally arranged a single printed-circuit board.

An input connector 22 for inputting a television signal and an output connector 23 for outputting the television signal distributed by the distributing unit are disposed on a short side plate 29 of the frame 21. Outer terminals 31 to 3, for power supply to each circuit component and input-output of signals, protrude from a first long side plate 30 contiguous to the short side plate 29. The distribution unit is disposed in the compartment 25 along the short side plate 29 to connect to the input connector 22, and the switching unit and the modulating unit are disposed in the compartment 28 along the short side plate 29 to connect to the output connector 23. The outer terminals 31 are disposed in the compartment 28 containing the switching unit and the modulating unit on the printed-circuit board.

The distribution unit disposed in the compartment 25 splits the input television signal into first and second television signal components and inputs the first television signal component to the tuner unit and the second television signal component to the switching unit. The tuner unit converts the first television signal component into an intermediate-frequency signal and outputs the intermediate-frequency signal to the demodulation unit. The demodulation unit demodulates the intermediate-frequency signal into a video signal and the like and outputs these signals to a video recorder (not shown in the drawing) through the terminals 33.

A video signal and the like from the video recorder are input to the modulating unit through the terminals 31, and are converted into a radio-frequency (RF) signal. The RF signal is then input to the switching unit. In a playback mode, the switching unit outputs the RF signal from the modulating unit to the output connector 23. Reproduced images are viewed on a television set (not shown in the drawing) having another television tuner device which is connected to the output connector 23. On the other hand, when the reproduced images are not viewed, the switching unit outputs the distributed signal directly to the output connector 23, and the received television signal can be visualized on the television set, as is disclosed, for example, in Japanese Unexamined Patent Application Publication No. 10-32514.

As shown in FIG. 3, the tuning unit disposed in the compartment 26 includes an input-signal-tuning circuit 40 for receiving the (RF) television signal, a high-frequency amplifier 41, an interstage tuning circuit 42, and a mixer circuit 43 connected in series. The tuning unit further includes an oscillator 44 providing the mixer circuit 43 with an oscillation signal, a phase-locked-loop (PLL) circuit 45 controlling the oscillation frequency of the oscillator 44, and a reference-signal oscillator 46 which connects to a crystal oscillator 47 and provides the PLL circuit 45 with a reference signal oscillating at a reference frequency. The intermediate-frequency signal (IF) is output from the mixer circuit 43 to the terminals 32 in FIG. 2.

In the above-described television tuner device, since the tuning unit includes the crystal oscillator providing the PLL circuit with the reference signal, harmonics from the crystal oscillator interfere with the intermediate-frequency signal.

SUMMARY

A television tuner device for generating an intermediate-frequency signal output from a mixer, having a crystal oscillator which provides a phase-locked-loop (PLL) circuit controlling an oscillator with a reference signal is described.

A television tuner device includes a distribution unit for splitting an input television signal into first and second television signal components; a tuning unit converting the first television signal component into an intermediate-frequency signal and outputting the intermediate-frequency. signal; and a rectangular metal frame including four side plates and containing the distribution unit and the tuning unit, in which a shielding plate separates the space defined by the metal frame into a first chamber at a first side plate and a second chamber at a second side plate opposite to the first side plate; the distribution unit is disposed in the first chamber; the tuning unit disposed in the second chamber includes a mixer circuit converting the first television signal component into the intermediate-frequency signal, an oscillator providing the mixer circuit with an oscillation signal, and a phase-locked-loop (PLL) circuit controlling the oscillation frequency of the oscillator; and a crystal oscillator providing the PLL circuit with a reference signal is disposed in the first chamber. Entry of harmonic energy from the crystal oscillator to the second chamber may be minimized.

In the television tuner device, the first chamber has a first connector, for inputting the input television signal, on the outer surface of a third side plate; and the first chamber also has a second connector on the outer surface of the first side plate or the outer surface of a fourth side plate, for outputting the second television signal component. This arrangement ensures an easy connection between the second connector and a connector of any other television tuner device which may be optionally provided.

DETAILED DESCRIPTION

Examples may be better understood with reference to the drawings, but the examples are not intended to be of a limiting nature. Rather, the invention is to cover all modifications, equivalents, and alternatives falling within the spirit and scope of the invention which is set forth by the claims.

Figure 1:
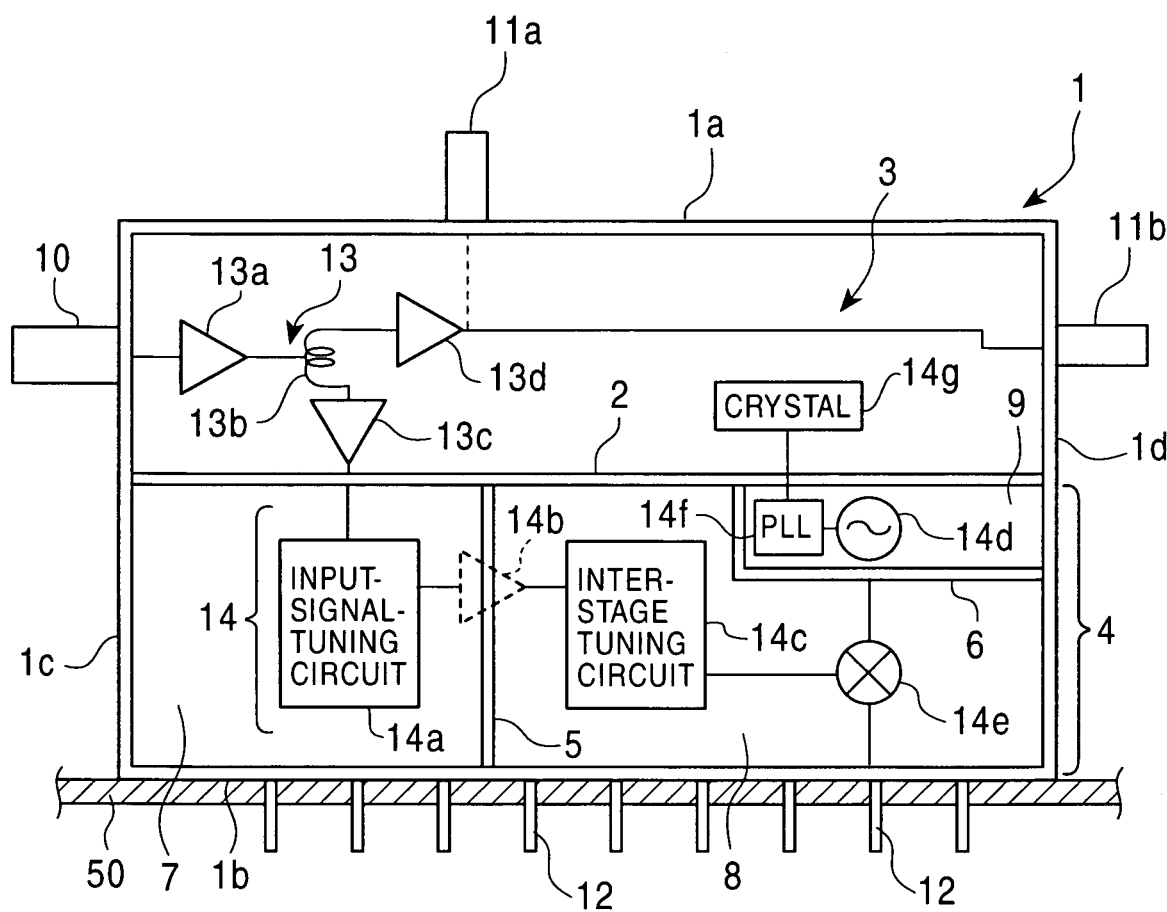
FIG. 1 is a view of the layout of functional blocks in a television tuner.
Figure 2:
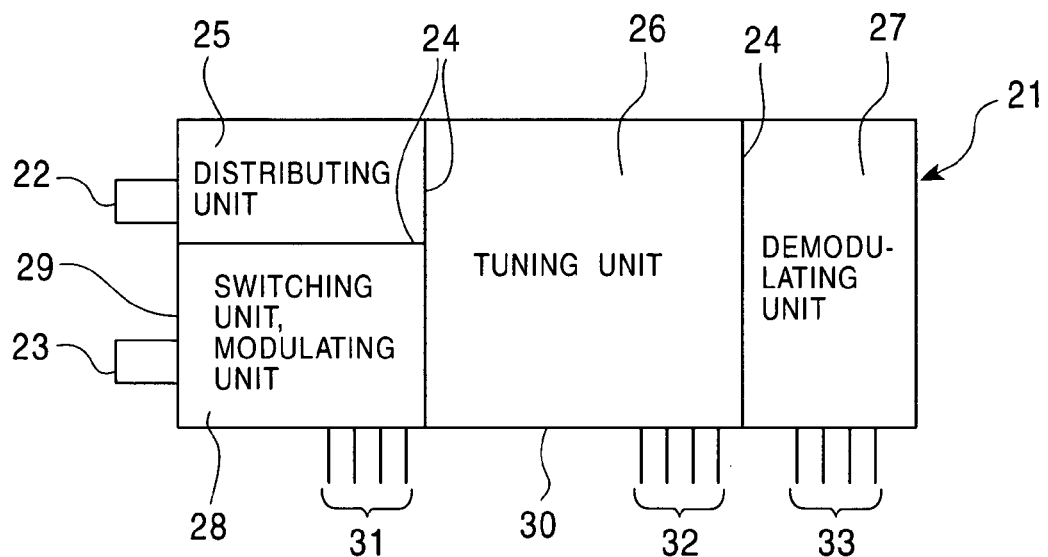
FIG. 2 is a view of the layout of functional blocks in a known television tuner device.
Figure 3:
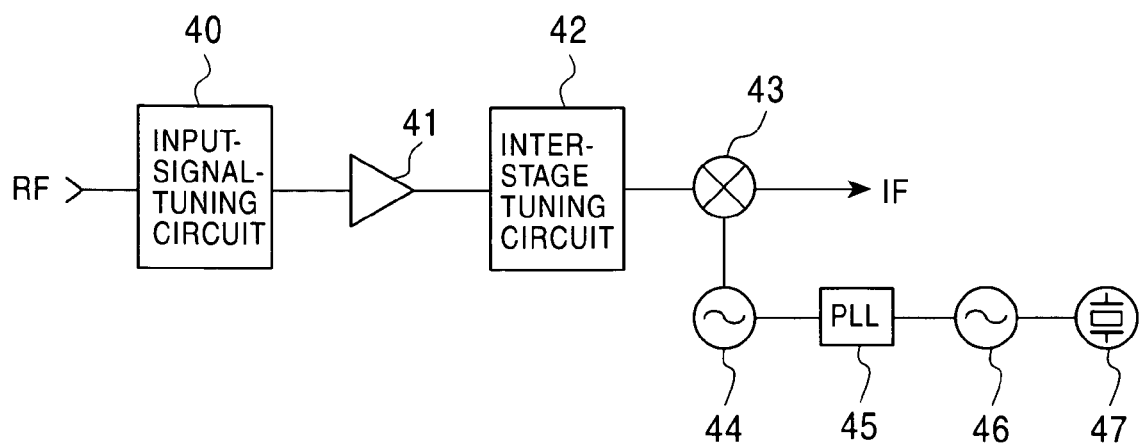
FIG. 3 is a block diagram of a tuning unit in a known television tuner device.

FIG. 1 is a layout of functional blocks in a television tuner device. A first shielding plate 2 is disposed in a rectangular metal frame 1. The first shielding plate 2 is parallel to both a first side plate 1a and a second side plate 1b and is connected to both a third side plate 1c and a fourth side plate 1d. The first shielding plate 2 separates the space defined by the metal frame 1 into a first chamber 3 contiguous with the first side plate 1a and a second chamber 4 contiguous with the second side plate 1b.

A second shielding plate 5 is connected to both the first shielding plate 2 and the second side plate 1b, and a third L-shaped shielding plate 6 is connected to both the first shielding plate 2 and the fourth side plate 1d. The space defined by the second chamber 4 is separated by the second shielding plate 5 and the third shielding plate 6 into the following three compartments: a first compartment 7 defined by the side plates 1b and 1c and the shielding plates 2 and 5; a second compartment 8 defined by the side plates 1b and 1d and the shielding plates 2, 5, and 6; and a third compartment 9 defined by the shielding plates 2 and 6 and the fourth side plate 1d.

The metal frame 1 holds a circuit board (not shown in the drawing) including various circuits in the first chamber 3 and the second chamber 4 (comprising the first to third compartments 7 to 9).

The first chamber 3 has a first connector 10 on the outer surface of the third side plate 1c, such as an F-type coaxial connector, for inputting a television signal. A second connector 11b such as a coaxial pin plug is disposed on the fourth side plate 1d for outputting the television signal. Alternatively, a second connector 11a instead of 11b may be disposed on the first side plate 1a. A plurality of terminals 12 is disposed on the second side plate 1b in a line at substantially the same interval.

The first connector 10 is disposed near the first chamber 3 to ensure an adequate vertical distance between the first connector 10 and the second side plate 1b when the terminals 12 are connected to a motherboard of a television receiver 50. The second connector 11a is disposed on the first side plate 1a, or the second connector 11b is disposed on the fourth side plate 1d opposite to the third side plate 1c having the first connector 10 thereon so as to ensure an easy connection between the television tuner device and any other television tuner device which may be, optionally, attached to the motherboard (not shown in the drawing).

The first chamber 3 holds a distribution unit 13 that includes a first broadband amplifier 13a, amplifying the input television signal, a distributor 13b such as a distribution transformer splitting the amplified television signal into first and second television signal components, a second broadband amplifier 13c amplifying the first distributed television signal component, and a third broadband amplifier 13d amplifying the second distributed television signal component. These three broadband amplifiers may not be present. The first broadband amplifier 13a disposed upstream of the distributor 13b may be effective in maintaining a low noise figure (NF.

The first broadband amplifier 13a is disposed between the first connector 10 and the distributor 13b which is disposed downstream toward the fourth side plate 1d.

The second broadband amplifier 13c is disposed near the first shielding plate 2 and is connected to the distributor 13b; the third broadband amplifier 13d is disposed toward the fourth side plate 1d and is connected to the distributor 13b; and the second connector 11a is disposed on the first side plate 1a and is connected to the third broadband amplifier 13d.

The second chamber 4 contains the tuning unit 14. The tuning unit 14 includes an input-signal-tuning circuit 14a, a high-frequency amplifier 14b (which may be mounted on a rear face of the circuit board), an interstage tuning circuit 14c, an oscillator 14d, a mixer circuit 14e, and a phase-locked-loop (PLL) circuit 14f. The input-signal-tuning circuit 14a including a UHF-band input-signal-tuning circuit and a VHF-band input-signal-tuning circuit is disposed in the first compartment 7 and is connected to the second broadband amplifier 13c. The high-frequency amplifier 14b including a UHF-band-amplifying circuit and a VHF-band-amplifying circuit may be disposed on the back side of the circuit board below the second shielding plate 5. The interstage tuning circuit 14c including a UHF-band input-signal-tuning circuit and a VHF-band input-signal-tuning circuit may be disposed near a side of the second compartment 8 adjacent to the second shielding plate 5 in FIG. 1. The oscillator 14d is disposed in the third compartment 9. The mixer circuit 14e is disposed in another side of the second compartment 8 adjacent to the fourth side plate 1d in FIG. 1.

A crystal oscillator 14g which generates and outputs a reference signal to the PLL circuit 14f is disposed in the first chamber 3.

In this structure, the television signal input through the first connector 10 is amplified by the first broadband amplifier 13a, and is then split by the distributor 13b into first and second television signal components. The first television signal component is input to the input-signal-tuning circuit 14a in the first compartment 7 through the second broadband amplifier 13c. Then, the first television signal component is input to the mixer circuit 14e through the high-frequency amplifier 14b and the interstage tuning circuit 14c, and is mixed with an oscillation signal so as to be converted into an intermediate-frequency signal and output to the terminals 12. Since the crystal oscillator 14g is disposed in the first chamber 3, the intermediate-frequency signal may have lower harmonic interference from the crystal oscillator 14g. The second television signal component distributed by the distributor 13b is output to another television tuner device through the third broadband amplifier 13d and the second connector 11a or 11b.

The first television signal component is output to the second chamber 4, which is isolated from the first chamber 3 by the first shielding plate 2, and the second television signal component is output to the second connector 11a disposed on the first side plate 1a. That is, the first and the second television signal components are output in opposite directions. Thus, mutual interference between the first and the second television signal components may be reduced. Moreover, the first and the second television signal components pass through the broadband amplifiers. This may reduce mutual interference at the outputs of the broadband amplifiers, and the first and the second television signal components may be better isolated from each other.

Although only a few exemplary embodiments of this invention have been described in detail above, those skilled in the art will readily appreciate that many modifications are possible in the exemplary embodiments without materially departing from the novel teachings and advantages of the invention. Accordingly, all such modifications are intended to be included within the scope of this invention as defined in the following claims.

What is claimed is:

1. A television tuner device comprising:
   a rectangular metal frame including four side plates;
   a first shield plate which separates a space defined by the metal frame into a first chamber contiguous with a first side plate and a second chamber contiguous with a second side plate opposite to the first side plate;
   a television signal input connector mounted on a third side plate and communicating with the first chamber, at least a first television signal component being output to the second chamber; and,
   a tuning unit disposed in the second chamber which converts the first television signal component into an intermediate-frequency signal and outputs the intermediate-frequency signal.

2. The television tuner device according to claim 1, having a distribution unit disposed in the first chamber, the distribution unit splitting an input television signal into at least a first and a second television signal.

3. The television tuner device according to claim 2, wherein the first chamber has a second connector on at least one of an outer surface of the first side plate and an outer surface of a fourth side plate, for outputting the second television signal component.

4. The television tuner device according to claim 1, wherein the intermediate frequency signal is output through the second side plate.

5. The television tuner device according to claim 1, wherein the second side plate is mounted to a motherboard.

6. The television tuner device according to claim 1, wherein the tuning unit disposed in the second chamber includes a mixer, an oscillator, and a PLL circuit which controls the oscillation frequency of the oscillator; and
   a crystal oscillator is disposed in the first chamber and provides the PLL circuit with a reference signal.

7. The television tuner device according to claim 6, wherein the tuner unit further comprises an input tuning circuit, a second shield plate separates the second chamber into at least a first compartment and a second compartment, the input tuning circuit being disposed in the first compartment, and the PLL circuit and the oscillator being disposed in the second compartment.

8. The television tuner device according to claim 7, wherein the tuner unit further comprises an interstage tuning unit, and an amplifier connecting the input signal tuning unit and the interstage tuning unit; a third shield plate which separates the second compartment into a first sub-compartment and a second sub-compartment, the PLL and the oscillator being disposed in the first sub-compartment and the interstage tuning unit and the mixer being disposed in the second sub-compartment.

9. The television tuner device according to claim 8, wherein the amplifier bridges the second shield plate and connects the input signal tuning circuit and the interstage tuning circuit.

10. The television tuner device according to claim 2, wherein the distribution unit comprises a splitter.

11. The television tuner device according to claim 10, wherein a first amplifier is disposed between the television signal input connector and the splitter.

12. The television tuner device according to claim 11, wherein at least a second amplifier is disposed on an opposite side of the splitter from the first amplifier.

13. The television tuner device according to claim 2, wherein at least a first amplifier is disposed on an opposite side of the splitter from the television signal input connector.

14. A method of reducing spurious signals in a television tuner, the method comprising:
   providing a shielded enclosure, having a rectangular metal frame including four side plates;
   providing a first shield plate separating the space defined by the metal frame into a first chamber contiguous with a first side plate and a second chamber contiguous with a second side plate opposite to the first side plate;
   providing a television signal input connector on a third side plate, said input connector communicating with the first chamber; and
   providing a tuning unit disposed in the second chamber which converts the first television signal into an intermediate-frequency signal and outputting the intermediate-frequency signal,
   wherein the tuning unit disposed in the second chamber includes a mixer, an oscillator, and a PLL circuit which controls an oscillation frequency of the oscillator, and a crystal oscillator which provides the PLL circuit with a reference signal and which is disposed in the first chamber.

15. The method according to claim 14, further comprising:
   providing a second shield plate separating the second chamber into a first and a second compartment, the tuning unit having an input tuning circuit disposed in the first compartment and an interstage tuning circuit disposed in the second compartment.

16. The method according to claim 15, further comprising:
   providing a third shield plate separating the second compartment into a first sub-compartment and a second sub-compartment, the input tuning circuit and mixer being disposed in the first sub-compartment, and the oscillator being disposed in the second sub-compartment.

* * * * *